United States Patent
Yao et al.

(10) Patent No.: US 9,417,497 B1
(45) Date of Patent: Aug. 16, 2016

(54) TFT ARRAY SUBSTRATE STRUCTURE

(71) Applicant: Shenzhen China Star Optoelectronics Technology Co., Ltd., Shenzhen, Guangdong (CN)

(72) Inventors: Xiaohui Yao, Guangdong (CN); Jehao Hsu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 239 days.

(21) Appl. No.: 14/382,018

(22) PCT Filed: Jul. 18, 2014

(86) PCT No.: PCT/CN2014/082503
§ 371 (c)(1),
(2) Date: Aug. 29, 2014

(87) PCT Pub. No.: WO2015/192436
PCT Pub. Date: Dec. 23, 2015

(30) Foreign Application Priority Data

Jun. 17, 2014 (CN) .......................... 2014 1 0271346

(51) Int. Cl.
*H01L 27/12* (2006.01)
*G02F 1/1362* (2006.01)
*G02F 1/1337* (2006.01)
*G02F 1/1368* (2006.01)
*H01L 29/786* (2006.01)

(52) U.S. Cl.
CPC ........ *G02F 1/136286* (2013.01); *G02F 1/1337* (2013.01); *G02F 1/1368* (2013.01); *H01L 29/78618* (2013.01); *H01L 29/78696* (2013.01); *G02F 2001/133742* (2013.01); *G02F 2201/56* (2013.01)

(58) Field of Classification Search
CPC .............. H01L 27/124; H01L 27/1259; H01L 27/3272; H01L 27/3248
USPC ................................................ 257/59–60, 72
See application file for complete search history.

(56) References Cited

U.S. PATENT DOCUMENTS 9,354,479 B2 * 5/2016 Kato .................... H01L 27/124
2013/0215341 A1 8/2013 Rho

FOREIGN PATENT DOCUMENTS

CN 1501152 A 6/2004

* cited by examiner

*Primary Examiner* — Cuong Q Nguyen
(74) *Attorney, Agent, or Firm* — Andrew C. Cheng

(57) ABSTRACT

The present invention provides a TFT array substrate structure, which includes first and second gates (11, 13), a semiconductor layer (20), first and second sources (31, 33), and first and second drains (42, 44). The first gate (11) and the first drain (42) are arranged to overlap in space so as to form a first overlapping zone (D). The second gate (13) and the second drain (44) are arranged to overlap in space so as to form a second overlapping zone (E). The first gate (11) has a first edge (113) corresponding to the first overlapping zone (D). The second gate (13) has a second edge (133) corresponding to the second overlapping zone (E). The first edge (113) and the first drain (42) intersect in space in an inclined manner. The second edge (133) and the second drain (44) intersect in space in an inclined manner. When the first and second drains (42, 44) are moved relative to the first and second gates (11, 13), areas of the first overlapping zone (D) and the second overlapping zone (E) undergo identical change.

10 Claims, 4 Drawing Sheets

TFT ARRAY SUBSTRATE STRUCTURE

BACKGROUND OF THE INVENTION

1. Field of the Invention

The present invention relates to the field of liquid crystal displaying, and in particular to a TFT (Thin-Film Transistor) array substrate structure.

2. The Related Arts

Liquid crystal displays (LCDs) have a variety of advantages, such as thin device body, low power consumption, and being free of radiation, and are thus widely used, such as mobile phones, personal digital assistants (PDAs), digital cameras, computer monitors, and screens of notebook computers.

A liquid crystal display generally comprises an enclosure, a liquid crystal display panel arranged in the enclosure, and a backlight module mounted in the enclosure. As shown in FIG. 1, a conventional liquid crystal display panel comprises a TFT array substrate 100, a color filter (CF) substrate 300 located above and bonded to the TFT array substrate 100, a liquid crystal layer 500 arranged the array substrate 100 and the CF substrate 300, and a sealant frame 700 and the operation principle thereof is a drive voltage is applied between the TFT array substrate 100 and the CF substrate 300 to control liquid crystal molecules contained in the liquid crystal layer 500 to rotate so as to refract out the light from the backlight module to generate an image.

The liquid crystal display panels that are available in the main stream market can be classified in three categories according to the arrangement of the liquid crystal molecules, which are TN (twisted nematic)/STN (super twisted nematic), IPS (in-plane switching)/FFS (fringe field switching), and VA (Vertical Alignment), wherein the VA type liquid crystal display has advantages, such as high contrast, wide view angle, and excellent color displaying. However, the VA type display uses vertical rotation type liquid crystal, which shows color shift at a large view angle. A known solution for such a phenomenon is to divide a pixel zone into a main zone and a sub zone. Electrical voltage applied to opposite sides of liquid crystal is different for the main zone and the sub zone so that the rotation angle of the liquid crystal in the main zone and the sub zone is different thereby overcoming the color shift problem.

As shown in FIG. 2, which shows a schematic view of a conventional TFT (Thin-Film Transistor) array substrate structure used in a VA type liquid crystal display, the TFT array substrate structure comprises first and second gates 101, 103, a semiconductor layer 200 arranged on the first and second gates 101, 103, first and second sources 301, 303 arranged on the semiconductor layer 200, and first and second drains 402, 404 arranged on the semiconductor layer 200. The first and second gates 101, 103 are electrically connected. The first and second sources 301, 303 are electrically connected. The first gate 101 and the first drain 402 are arranged to overlap in space so as to form a first overlapping zone A and the first gate 101 has a first edge 105 corresponding to the first overlapping zone A and perpendicularly intersecting the first drain 402 in space. The second gate 103 and the second drain 404 are arranged to overlap in space so as to form a second overlapping zone B and the second gate 103 has a second edge 107 corresponding to the second overlapping zone B and perpendicularly intersecting the second drain 404 in space. A portion of the first drain 402 that corresponds to the first overlapping zone A and a portion of the second drain 404 that corresponds to the second overlapping zone B are each in the form of a strip, the two strips being arranged in directions that are perpendicular. The first source 301 is electrically connected to a data line; the first gate 101 is electrically connected to a gate scan line; and the first and second drains 402, 404 are respectively and electrically connected to a pixel electrode in a main zone and a sub zone. The first overlapping zone A induces a first parasitic capacitance and $C_{gs}1$ and the second overlapping zone B induces a second parasitic capacitance $C_{gs}2$. With the direction of strip of the first drain 402 being taken as a vertical direction, when the first and second drains 402, 404 moved relative to the first and second gates 101, 103 in the vertical direction, the first overlapping zone A undergoes a change of the area thereof, while the second overlapping zone B maintain constant the area thereof so that the first parasitic capacitance $C_{gs}1$ changes but the second parasitic capacitance $C_{gs}2$ does not.

According to the feed-through voltage formula:

$$\text{feed-through voltage } \Delta V = [C_{gs}/(C_{lc}+C_s+C_{gs})] \times V_{p\text{-}p}$$

where $C_{lc}$ is capacitance induced by a liquid crystal cell, $C_s$ is storage capacitance, $C_{gs}$ is the capacitance value of a parasitic capacitance induced between a gate and a drain, and $V_{p\text{-}p}$ is voltage change of the gate.

It can be appreciated that the first feed-through voltage $\Delta V1$ changes but the second feed-through voltage $\Delta V2$ does not so that the voltage difference between is changed, making reference voltage VCOM for the rotation of liquid crystal molecules between the main zone and the sub zone changed.

Similarly, when the first and second drains 402, 404 are moved relative to the first and second gates 101, 103 in a horizontal direction, the area of the first overlapping zone A remains unchanged, but the area of the second overlapping zone B changes, so that the first parasitic capacitance $C_{gs}1$ does not change but the second parasitic capacitance $C_{gs}2$ changes, thereby making the first feed-through voltage $\Delta V1$ not change but the second feed-through voltage $\Delta V2$ changed, eventually leading to a change of VCOM.

Instability of VCOM would causes problems of flickering and image sticking occurring in a liquid crystal display panel thereby affecting the displaying quality. It is apparently desired to have further improvements over the known TFT array substrate structure.

SUMMARY OF THE INVENTION

An object of the present invention is to provide a TFT (Thin-Film Transistor) array substrate structure, in which two gates have portions corresponding overlapping zones and having two edges that are arranged to be inclined with respect to two drains so that when the drains are moved relative to the gates, the changes of the areas of the two overlapping zones are similar, allowing the reference voltage VCOM for rotation of liquid crystal molecules between main zones and sub zones of sub-pixels to be maintained stable and providing the TFT array substrate and the structure is simple and easy achievement can be realized.

To achieve the above object, the present invention provides a TFT array substrate structure, which comprises: first and second gates, a semiconductor layer arranged on the first and second gates, first and second sources arranged on the semiconductor layer, and first and second drains arranged on the semiconductor layer. The first and second gates are electrically connected. The first and second sources are electrically connected. The first gate and the first drain are arranged to overlap in space so as to form a first overlapping zone. The second gate and the second drain are arranged to overlap in space so as to form a second overlapping zone. The first gate has a first edge corresponding to the first overlapping zone.

The second gate has a second edge corresponding to the second overlapping zone. The first edge and the first drain intersect in space in an inclined manner and the second edge and the second drain intersect in space in an inclined manner, so that when the first and second drains are moved relative to the first and second gates, areas of the first overlapping zone and the second overlapping zone undergo change in the same direction.

The first and second drains are moved relative to the first and second gates, the areas of the first overlapping zone and the second overlapping zone undergo identical change.

The inclination of the first edge with respect to the first drain is in a direction that is opposite to a direction of the inclination of the second edge with respect to the second drain.

The first drain has a portion corresponding to the first overlapping zone and in the form of a strip and the second drain has a portion corresponding to the second overlapping zone and in the form of a strip. The two strips are respectively in directions that are perpendicular.

The first drain has a width W1 corresponding to the first overlapping zone and the second drain has a width W2 corresponding to the second overlapping zone. The first edge and the first drain define an acute included angle $\alpha 1=\text{arccot}(W2/W1)$. The second edge and the second drain define an acute included angle $\alpha 2=\text{arccot}(W1/W2)$.

The first source is in the form of a U-shape having an upward-facing opening and the second source is in the form of a U-shape having a rightward-facing opening. The first source has a right portion connected to a left portion of the second source.

The first drain extends into the U-shaped opening of the first source and the second drain extends into the U-shaped opening of the second source.

The TFT array substrate structure is applicable to a vertical alignment type liquid crystal display panel.

The TFT array substrate structure is applicable to a curved liquid crystal display panel.

The present invention also provides a TFT array substrate structure, which comprises: first and second gates, a semiconductor layer arranged on the first and second gates, first and second sources arranged on the semiconductor layer, and first and second drains arranged on the semiconductor layer, the first and second gates being electrically connected, the first and second sources being electrically connected, the first gate and the first drain being arranged to overlap in space so as to form a first overlapping zone, the second gate and the second drain being arranged to overlap in space so as to form a second overlapping zone, the first gate having a first edge corresponding to the first overlapping zone, the second gate having a second edge corresponding to the second overlapping zone, the first edge and the first drain intersecting in space in an inclined manner, the second edge and the second drain intersecting in space in an inclined manner, so that when the first and second drains are moved relative to the first and second gates, areas of the first overlapping zone and the second overlapping zone undergo change in the same direction;

wherein when the first and second drains are moved relative to the first and second gates, the areas of the first overlapping zone and the second overlapping zone undergo identical change;

wherein the inclination of the first edge with respect to the first drain is in a direction that is opposite to a direction of the inclination of the second edge with respect to the second drain;

wherein the first drain has a portion corresponding to the first overlapping zone and in the form of a strip and the second drain has a portion corresponding to the second overlapping zone and in the form of a strip, the two strips being respectively in directions that are perpendicular;

wherein the first drain has a width W1 corresponding to the first overlapping zone and the second drain has a width W2 corresponding to the second overlapping zone, the first edge and the first drain defining an acute included angle $\alpha 1=\text{arccot}(W2/W1)$, the second edge and the second drain defining an acute included angle $\alpha 2=\text{arccot}(W1/W2)$;

wherein the first source is in the form of a U-shape having an upward-facing opening and the second source is in the form of a U-shape having a rightward-facing opening, the first source having a right portion connected to a left portion of the second source;

wherein the first drain extends into the U-shaped opening of the first source and the second drain extends into the U-shaped opening of the second source; and wherein the TFT array substrate structure is applicable to a vertical alignment type liquid crystal display panel.

The efficacy of the present invention is that the present invention provides an array substrate structure, in which two gates have portions corresponding overlapping zones and having two edges that are arranged to be inclined with respect to two drains so that when the drains are moved relative to the gates, the changes of the areas of the two overlapping zones are similar, allowing the reference voltage VCOM for rotation of liquid crystal molecules between main zones and sub zones of sub-pixels to be maintained stable and providing the TFT array substrate with a self-regulation function for VCOM thereby overcoming the problems of flickering and image sticking occurring in a liquid crystal display panel resulting from unstable VCOM so as to enhance overall displaying quality.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
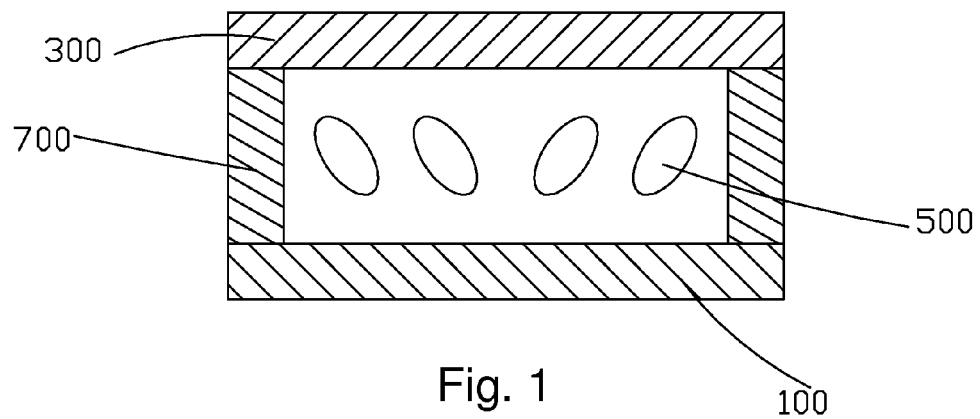
FIG. 1 is a cross-sectional view showing of a conventional liquid crystal display panel.
Figure 2:
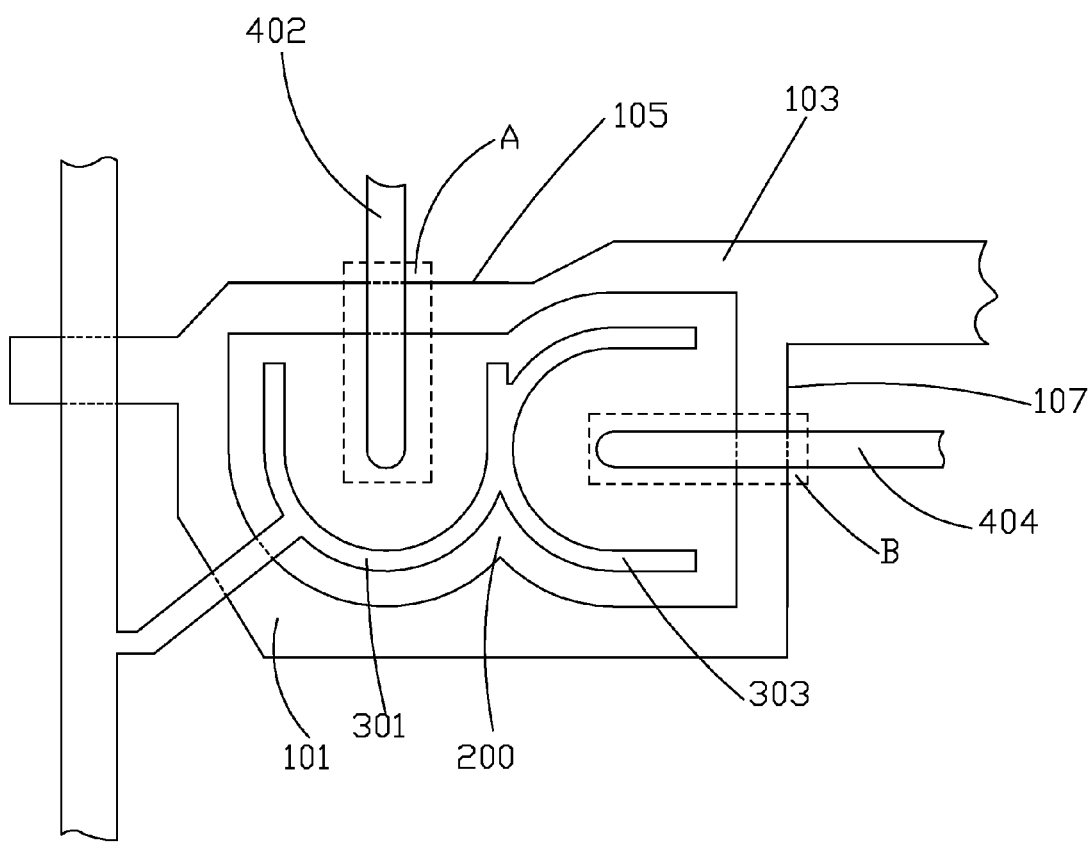
FIG. 2 is a schematic view showing the structure of a conventional TFT (Thin-Film Transistor) array substrate.
Figure 3:
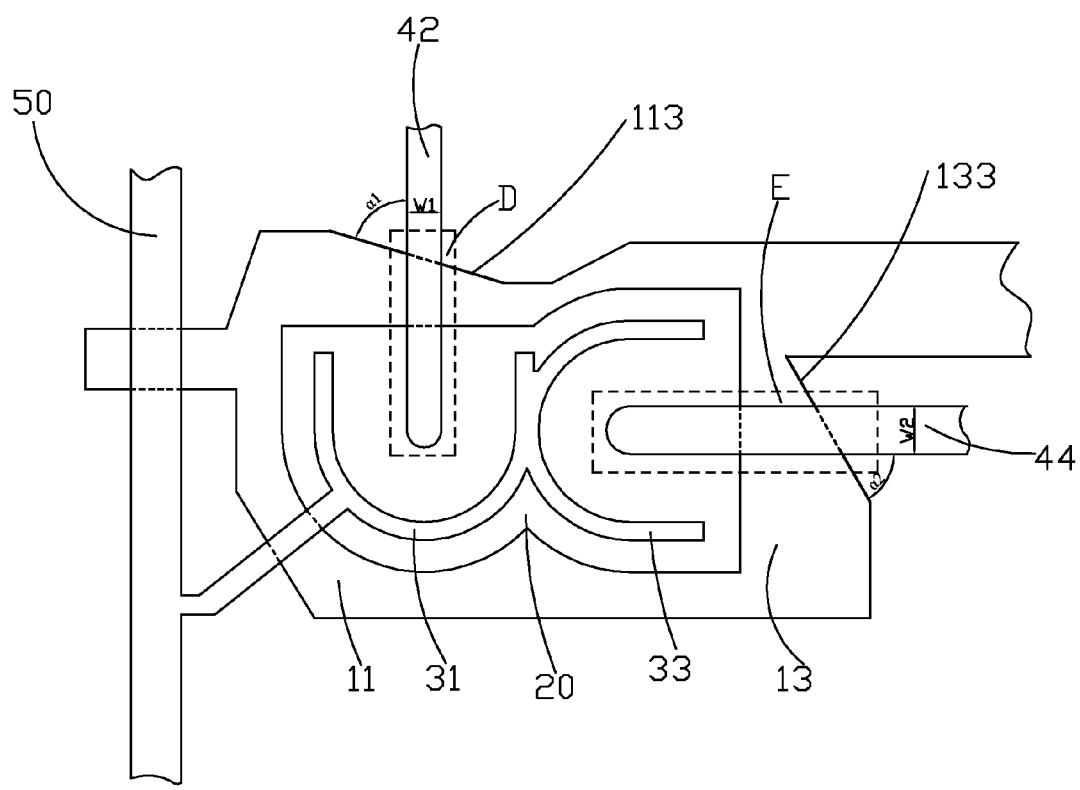
FIG. 3 is a schematic view showing a TFT array substrate structure according to the present invention.

Referring to FIG. 3, the preset invention provides a TFT (Thin-Film Transistor) array substrate structure, which comprises: first and second gates 11, 13, a semiconductor layer 20 arranged on the first and second gates 11, 13, first and second sources 31, 33 arranged on the semiconductor layer 20, and first and second drains 42, 44 arranged on the semiconductor layer 20. The first and second gates 11, 13 are electrically connected. The first and second sources 31, 33 are electrically connected. The first gate 11 and the first drain 42 are arranged to overlap in space so as to form a first overlapping zone D. The second gate 13 and the second drain 44 are arranged to overlap in space so as to form a second overlapping zone E. The first gate 11 has a first edge 113 corresponding to the first overlapping zone D. The second gate 13 has a second edge 133 corresponding to the second overlapping zone E. The first edge 113 and the first drain 42 intersect in space in an inclined manner. The second edge 133 and the second drain 44 intersect in space in an inclined manner. The inclination of the first edge 113 with respect to the first drain 42 is in a direction that is opposite to a direction of the inclination of the second edge 133 with respect to the second drain 44. In the instant embodiment, the first edge 113 is inclined downward with respect to the first drain 42 in a direction from left to right and the second edge 133 is inclined upward with respect to the second drain 44 in a direction from left to right.

Thus, when the first and second drains 42, 44 are moved relative to the first and second gates 11, 13, areas of the first overlapping zone D and the second overlapping zone E undergo change in the same direction.

Further, when the first and second drains 42, 44 are moved relative to the first and second gates 11, 13, the areas of the first overlapping zone D and the second overlapping zone E undergo identical change.

The first drain 42 has a portion corresponding to the first overlapping zone D and in the form of a strip. The second drain 44 has a portion corresponding to the second overlapping zone E and in the form of a strip. The two strips are respectively in directions that are perpendicular.

The first drain 42 has a width W1 corresponding to the first overlapping zone D and the second drain 44 has a width W2 corresponding to the second overlapping zone E. The first edge 113 and the first drain 42 define an acute included angle α1=arccot(W2/W1) and the second edge 133 and the second drain 44 define an acute included angle α2=arccot(W1/W2).

The first source 31 is in the form of a U-shape having an upward-facing opening and the second source 33 is in the form of a U-shape having a rightward-facing opening. The first source 31 has a right portion connected to a left portion of the second source 33.

The first drain 42 extends into the U-shaped opening of the first source 31 and the second drain 44 extends into the U-shaped opening of the second source 33.

The first source 31 is electrically connected to a data line 50. The first gate 11 is electrically connected to a gate scan line (not shown). The first drain 42 and the second drain 44 are electrically connected to a pixel electrode (not shown).

Figure 4:
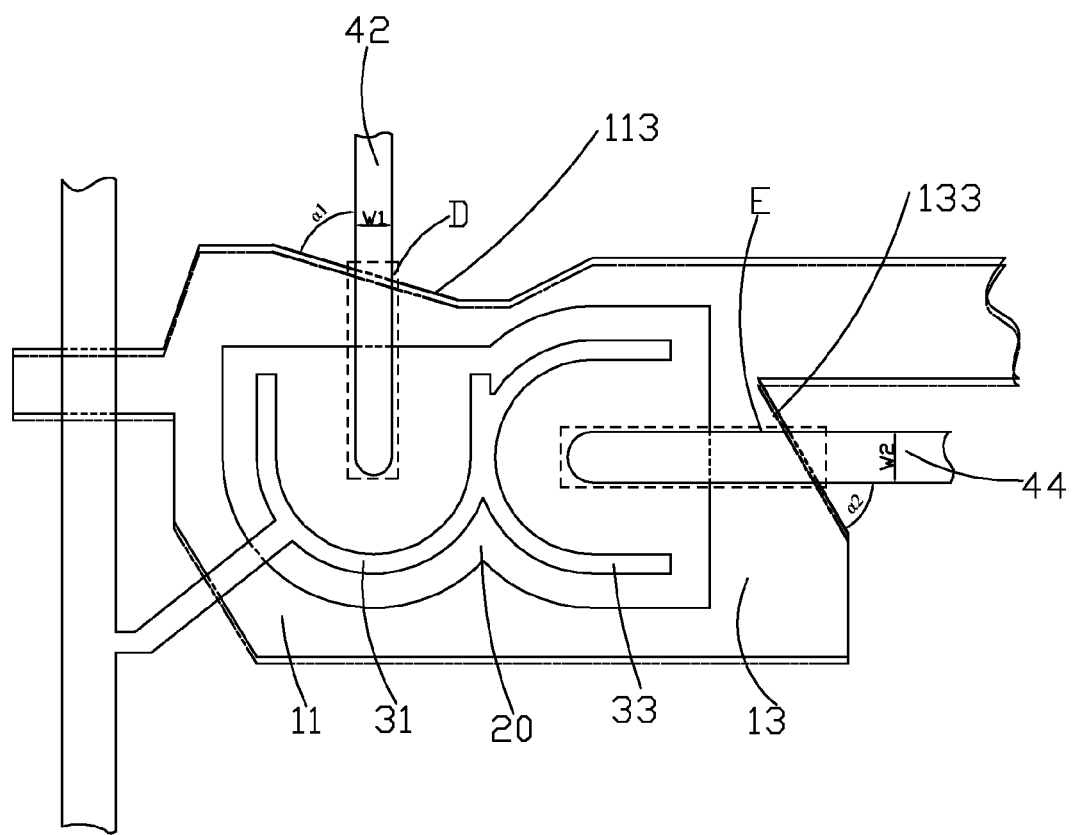
FIG. 4 is a schematic view illustrating drains moved relative to gates in a vertical direction, in which the solid lines indicate the condition before the movement and the two-dashed phantom lines indicate the condition after the movement.

Referring to FIG. 4, with the direction of the strip of the first drain 42 taken as the vertical direction, when the first and second drains 42, 44 are moved upward, relative to the first and second gates 11, 13, in the vertical direction, the area of the first overlapping zone D between the first gate 11 and the first drain 42 is reduced and the area of the second overlapping zone E between the second gate 13 and the second drain 44 is also reduced correspondingly.

Assuming the amount of movement is V and the areas the first ad second overlapping zones D, E are respectively reduced by ΔS1, ΔS2, according area formula of parallelogram, the following is obtained:

$$\Delta S1 = W1 \times V$$

$$\Delta S2 = W2 \times V \times \cot \alpha 2$$

By combining with α2=arccot(W1/W2)

$$\Delta S2 = W2 \times V \times (W1/W2) = W1 \times V$$

And, it is obtained that ΔS1=ΔS2

Similarly, when the first and second drains 42, 44 are moved downward, relative to the first and second gates 11, 13, in the vertical direction, the area of the first overlapping zone D is enlarged and the area of the second overlapping zone E is correspondingly enlarged by the same amount.

Figure 5:
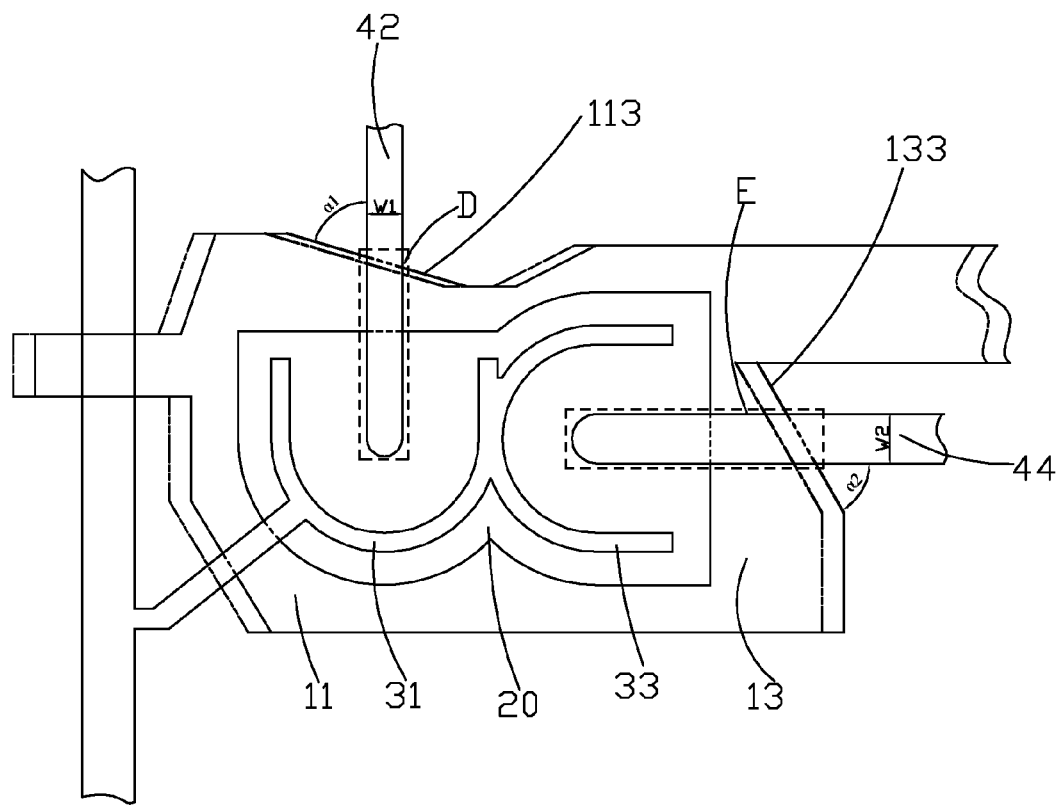
FIG. 5 is a schematic view illustrating drains moved relative to gates in a horizontal direction, in which the solid lines indicate the condition before the movement and the two-dashed phantom lines indicate the condition after the movement.

Referring to FIG. 5, when the first and second drains 42, 44 are moved leftward relative to the first and second gates 11, 13 in a horizontal direction, the area of the first overlapping zone D between the first gate 11 and the first drain 42 is reduced and the area of the second overlapping zone E between the second gate 13 and the second drain 44 is also reduced correspondingly.

Assuming the amount of movement is H and the areas of the second and first overlapping zones D, E are respectively reduced by ΔS2', ΔS1', according area formula of parallelogram, the following is obtained:

$$\Delta S2' = W2 \times H$$

$$\Delta S1 = W2 \times H \times \cot \alpha 1$$

By combining with α1=arccot(W2/W1)

$$\Delta S1 = W1 \times H \times (W2/W1) = W2 \times H$$

And, it is obtained that ΔS1'=ΔS2'

Similarly, when the first and second drains 42, 44 are moved rightward relative to the first and second gates 11, 13 in the horizontal direction, the area of the first overlapping zone D is enlarged and the area of the second overlapping zone E is correspondingly enlarged by the same amount.

It can be seen that when the first and second drains 42, 44 undergo relative movement with respect to the first and second gates 11, 13, the changes of the areas of the first overlapping zone D, the second overlapping zone E are of the same trend and the same amount so that first parasitic capacitance $C_{gs}1$ induced by the first overlapping zone D and second parasitic capacitance $C_{gs}2$ induced by the second overlapping zone E are of changes of the same trend and same amount. It can be inferred from the feed-through voltage formula that a first feed-through voltage ΔV1 and a second feed-through voltage ΔV2 would be of the same trend and the same amount, meaning a voltage difference therebetween is kept invariable, whereby the reference voltage VCOM for rotation of liquid crystal molecules between main zones and sub zones of sub-pixels can be maintained relatively stable. Thus, the TFT array substrate structure of the present invention is applicable to a vertical alignment type liquid crystal display panel and is also applicable to a curved liquid crystal display panel and also a vertical alignment type curved liquid crystal display panel.

The present invention provides a TFT array substrate structure, in which two gates have portions corresponding overlapping zones and having two edges that are arranged to be inclined with respect to two drains so that when the drains are moved relative to the gates, the changes of the areas of the two overlapping zones are similar, allowing the reference voltage VCOM for rotation of liquid crystal molecules between main zones and sub zones of sub-pixels to be maintained stable and providing the TFT array substrate with a self-regulation function for VCOM thereby overcoming the problems of flickering and image sticking occurring in a liquid crystal display panel resulting from unstable reference voltage VCOM of rotation of liquid crystal molecules so as to enhance overall displaying quality and being simple in structure and easy to achieve.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) array substrate structure, comprising: first and second gates, a semiconductor layer arranged on the first and second gates, first and second sources arranged on the semiconductor layer, and first and second drains arranged on the semiconductor layer, the first and second gates being electrically connected, the first and second sources being electrically connected, the first gate and the first drain being arranged to overlap in space so as to form a first overlapping zone, the second gate and the second drain being arranged to overlap in space so as to form a second overlapping zone, the first gate having a first edge corresponding to the first overlapping zone, the second gate having a second edge corresponding to the second overlapping zone, the first edge and the first drain intersecting in space in an inclined manner, the second edge and the second drain intersecting in space in an inclined manner, so that when the first and second drains are moved relative to the first and second gates, areas of the first overlapping zone and the second overlapping zone undergo change in the same direction.

2. The TFT array substrate structure as claimed in claim 1, wherein when the first and second drains are moved relative to the first and second gates, the areas of the first overlapping zone and the second overlapping zone undergo identical change.

3. The TFT array substrate structure as claimed in claim 1, wherein the inclination of the first edge with respect to the first drain is in a direction that is opposite to a direction of the inclination of the second edge with respect to the second drain.

4. The TFT array substrate structure as claimed in claim 3, wherein the first drain has a portion corresponding to the first overlapping zone and in the form of a strip and the second drain has a portion corresponding to the second overlapping zone and in the form of a strip, the two strips being respectively in directions that are perpendicular.

5. The TFT array substrate structure as claimed in claim 4, wherein the first drain has a width W1 corresponding to the first overlapping zone and the second drain has a width W2 corresponding to the second overlapping zone, the first edge and the first drain defining an acute included angle $\alpha 1=\text{arccot}(W2/W1)$, the second edge and the second drain defining an acute included angle $\alpha 2=\text{arccot}(W1/W2)$.

6. The TFT array substrate structure as claimed in claim 1, wherein the first source is in the form of a U-shape having an upward-facing opening and the second source is in the form of a U-shape having a rightward-facing opening, the first source having a right portion connected to a left portion of the second source.

7. The TFT array substrate structure as claimed in claim 6, wherein the first drain extends into the U-shaped opening of the first source and the second drain extends into the U-shaped opening of the second source.

8. The TFT array substrate structure as claimed in claim 1, wherein the TFT array substrate structure is applicable to a vertical alignment type liquid crystal display panel.

9. The TFT array substrate structure as claimed in claim 1, wherein the TFT array substrate structure is applicable to a curved liquid crystal display panel.

10. A thin-film transistor (TFT) array substrate structure, comprising: first and second gates, a semiconductor layer arranged on the first and second gates, first and second sources arranged on the semiconductor layer, and first and second drains arranged on the semiconductor layer, the first and second gates being electrically connected, the first and second sources being electrically connected, the first gate and the first drain being arranged to overlap in space so as to form a first overlapping zone, the second gate and the second drain being arranged to overlap in space so as to form a second overlapping zone, the first gate having a first edge corresponding to the first overlapping zone, the second gate having a second edge corresponding to the second overlapping zone, the first edge and the first drain intersecting in space in an inclined manner, the second edge and the second drain intersecting in space in an inclined manner, so that when the first and second drains are moved relative to the first and second gates, areas of the first overlapping zone and the second overlapping zone undergo change in the same direction;

wherein when the first and second drains are moved relative to the first and second gates, the areas of the first overlapping zone and the second overlapping zone undergo identical change;

wherein the inclination of the first edge with respect to the first drain is in a direction that is opposite to a direction of the inclination of the second edge with respect to the second drain;

wherein the first drain has a portion corresponding to the first overlapping zone and in the form of a strip and the second drain has a portion corresponding to the second overlapping zone and in the form of a strip, the two strips being respectively in directions that are perpendicular;

wherein the first drain has a width W1 corresponding to the first overlapping zone and the second drain has a width W2 corresponding to the second overlapping zone, the first edge and the first drain defining an acute included angle $\alpha 1=\text{arccot}(W2/W1)$, the second edge and the second drain defining an acute included angle $\alpha 2=\text{arccot}(W1/W2)$;

wherein the first source is in the form of a U-shape having an upward-facing opening and the second source is in the form of a U-shape having a rightward-facing opening, the first source having a right portion connected to a left portion of the second source;

wherein the first drain extends into the U-shaped opening of the first source and the second drain extends into the U-shaped opening of the second source; and wherein the TFT array substrate structure is applicable to a vertical alignment type liquid crystal display panel.

\* \* \* \* \*